United States Patent
Huang

(10) Patent No.: US 11,823,984 B2
(45) Date of Patent: Nov. 21, 2023

(54) METHOD FOR FABRICATING SEMICONDUCTOR DEVICE WITH PLUG STRUCTURE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 200 days.

(21) Appl. No.: 17/497,775

(22) Filed: Oct. 8, 2021

(65) Prior Publication Data
US 2023/0111315 A1  Apr. 13, 2023

(51) Int. Cl.
| H01L 23/485 | (2006.01) |
| H01L 21/768 | (2006.01) |
| H01L 23/532 | (2006.01) |

(52) U.S. Cl.
CPC ...... *H01L 23/485* (2013.01); *H01L 21/76805* (2013.01); *H01L 21/76897* (2013.01); *H01L 23/53223* (2013.01); *H01L 23/53238* (2013.01); *H01L 23/53266* (2013.01)

(58) Field of Classification Search
CPC ............. H01L 23/485; H01L 23/53223; H01L 23/53238; H01L 23/53266; H01L 21/76897; H01L 21/76805
See application file for complete search history.

(56) References Cited

U.S. PATENT DOCUMENTS

| 7,820,537 B1 * | 10/2010 | Kim ............... H01L 21/76897 438/584 |
| 2017/0018500 A1 | 1/2017 | Lee et al. |
| 2019/0109044 A1 | 4/2019 | Lin et al. |

(Continued)

FOREIGN PATENT DOCUMENTS

| TW | 201705360 A | 2/2017 |
| TW | 201935642 A | 9/2019 |

(Continued)

OTHER PUBLICATIONS

Office Action and Search Report dated Dec. 5, 2022 related to Taiwanese Application No. 111100339.

*Primary Examiner* — Syed I Gheyas
*Assistant Examiner* — Vicki B. Booker
(74) *Attorney, Agent, or Firm* — Xuan Zhang

(57) ABSTRACT

A method for fabricating a semiconductor device includes providing a substrate; sequentially forming a layer of first conductive material, a layer of second conductive material, a layer of third conductive material, and an anti-reflective coating layer over the substrate; performing a plug etch process to turn the layer of first conductive material into a bottom conductive layer on the substrate, turn the layer of second conductive material into a middle conductive layer on the bottom conductive layer, and turn the layer of third conductive material into a top conductive layer on the middle conductive layer; selectively forming an insulating covering layer on a sidewall of the middle conductive layer, wherein the bottom conductive layer, the middle conductive layer, the top conductive layer, and the insulating covering layer together configure a plug structure; and forming a first dielectric layer on the substrate and surrounding the plug structure.

7 Claims, 15 Drawing Sheets

(56) References Cited

U.S. PATENT DOCUMENTS

| | | |
|---|---|---|
| 2020/0286792 A1 | 9/2020 | St. Amour et al. |
| 2021/0280459 A1 | 9/2021 | Khaderbad et al. |

FOREIGN PATENT DOCUMENTS

| | | |
|---|---|---|
| TW | 202101733 A | 1/2021 |
| TW | 202114114 A | 4/2021 |
| TW | 202133285 A | 9/2021 |

* cited by examiner

METHOD FOR FABRICATING SEMICONDUCTOR DEVICE WITH PLUG STRUCTURE

TECHNICAL FIELD

The present disclosure relates to a method for fabricating the semiconductor device, and more particularly, to a method for fabricating the semiconductor device with the plug structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a plug structure including a bottom conductive layer positioned on the substrate, a middle conductive layer positioned on the bottom conductive layer, a top conductive layer positioned on the middle conductive layer, and an insulating covering layer covering a sidewall of the middle conductive layer and positioned between the bottom conductive layer and the top conductive layer; and a first dielectric layer positioned on the substrate and surrounding the plug structure. A width of the bottom conductive layer is greater than a width of the middle conductive layer. A width of the top conductive layer is greater than the width of the middle conductive layer.

In some embodiments, the width of the bottom conductive layer and a total width consisting of the width of the middle conductive layer and a thickness of the insulating covering layer are about the same.

In some embodiments, a sidewall of the top conductive layer, a sidewall of the insulating covering layer, and a sidewall of the bottom conductive layer are substantially coplanar.

In some embodiments, a top surface of the first dielectric layer is at a vertical level between about a top surface of the top conductive layer and a bottom surface of the top conductive layer.

In some embodiments, the semiconductor device includes a bottom dielectric layer positioned between the first dielectric layer and the substrate.

In some embodiments, the semiconductor device includes a second dielectric layer positioned on the first dielectric layer. A top surface of the second dielectric layer is at a vertical level greater than the top surface of the top conductive layer.

In some embodiments, the semiconductor device includes a contact positioned on the top conductive layer and electrically connected to the top conductive layer.

In some embodiments, the contact includes a lower portion positioned on the top conductive layer and an upper portion positioned on the lower portion, and a width of the upper portion is greater than a width of the lower portion.

In some embodiments, the semiconductor device includes a third dielectric layer positioned on the second dielectric layer and surrounding the contact.

In some embodiments, a thickness of the bottom conductive layer and a thickness of the top conductive layer are about the same.

In some embodiments, a thickness of the bottom conductive layer is greater than a thickness of the top conductive layer.

In some embodiments, the first dielectric layer includes a porous dielectric material, the middle conductive layer includes aluminum and copper, the bottom conductive layer and the top conductive layer include titanium and titanium nitride, and the insulating covering layer includes aluminum oxide.

In some embodiments, a ratio of a thickness of the insulating covering layer to a width of the middle conductive layer is between about 1:20 and about 1:2000.

Another aspect of the present disclosure provides a method for fabricating a semiconductor device including providing a substrate; sequentially forming a layer of first conductive material, a layer of second conductive material, a layer of third conductive material, and an anti-reflective coating layer over the substrate; performing a plug etch process to turn the layer of first conductive material into a bottom conductive layer on the substrate, turn the layer of second conductive material into a middle conductive layer on the bottom conductive layer, and turn the layer of third conductive material into a top conductive layer on the middle conductive layer; selectively forming an insulating covering layer on a sidewall of the middle conductive layer, wherein the bottom conductive layer, the middle conductive layer, the top conductive layer, and the insulating covering layer together configure a plug structure; and forming a first dielectric layer on the substrate and surrounding the plug structure. A width of the bottom conductive layer is greater than a width of the middle conductive layer, and a width of the top conductive layer is greater than the width of the middle conductive layer.

In some embodiments, the first dielectric layer includes a porous dielectric material, the middle conductive layer includes aluminum and copper, the bottom conductive layer and the top conductive layer include titanium and titanium nitride, and the insulating covering layer includes aluminum oxide.

In some embodiments, the method for fabricating the semiconductor device includes forming a bottom dielectric layer between the first dielectric layer and the substrate.

In some embodiments, the method for fabricating the semiconductor device includes performing an etch back process to lower a top surface of the first dielectric layer to a vertical level between a top surface of the top conductive layer and a bottom surface of the top conductive layer.

In some embodiments, the method for fabricating the semiconductor device includes forming a second dielectric layer on the first dielectric layer and surrounding the top conductive layer and the anti-reflective coating layer; forming a third dielectric layer on the second dielectric layer and the anti-reflective coating layer; forming a contact hole by removing the anti-reflective coating layer and a portion of the third dielectric layer, wherein the top conductive layer is exposed through the contact hole; and forming a contact in the contact hole and electrically connected to the top conductive layer.

In some embodiments, a hardness of the second dielectric layer may be greater than a hardness of the first dielectric layer.

In some embodiments, the bottom dielectric layer includes silicon dioxide, undoped silicate glass, fluorosilicate glass, borophosphosilicate glass, a spin-on low-k dielectric layer, a chemical vapor deposition low-k dielectric layer, or a combination thereof.

Due to the design of the semiconductor device of the present disclosure, the insulating covering layer may prevent the metal ions in the middle conductive layer diffusing out to contaminate adjacent elements (e.g., the first dielectric layer) so that short between adjacent conductive features may be reduced. As a result, the reliability and electrical characterization performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
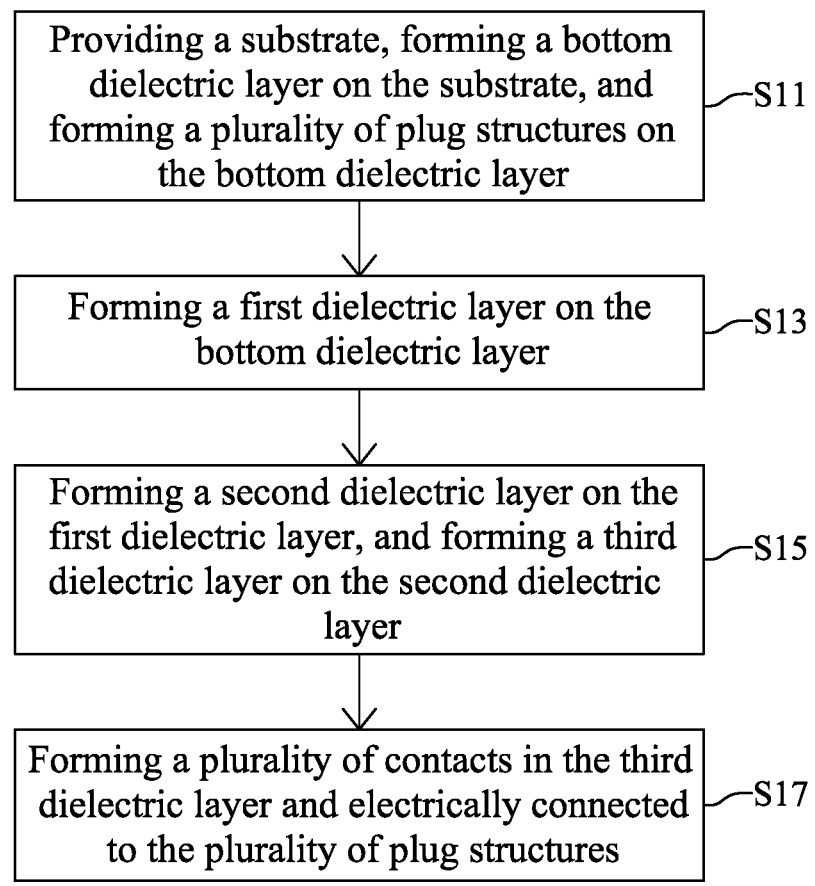
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two FIGS. shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A in accordance with one embodiment of the present disclosure. FIGS. 2 to 11 illustrate, in schematic cross-sectional view diagrams, a flow for fabricating the semiconductor device 1A in accordance with one embodiment of the present disclosure.

With reference to FIGS. 1 to 5, at step S11, a substrate 101 may be provided, a bottom dielectric layer 301 may be formed on the substrate 101, and a plurality of plug structures 201 may be formed on the bottom dielectric layer 301.

Figure 2:
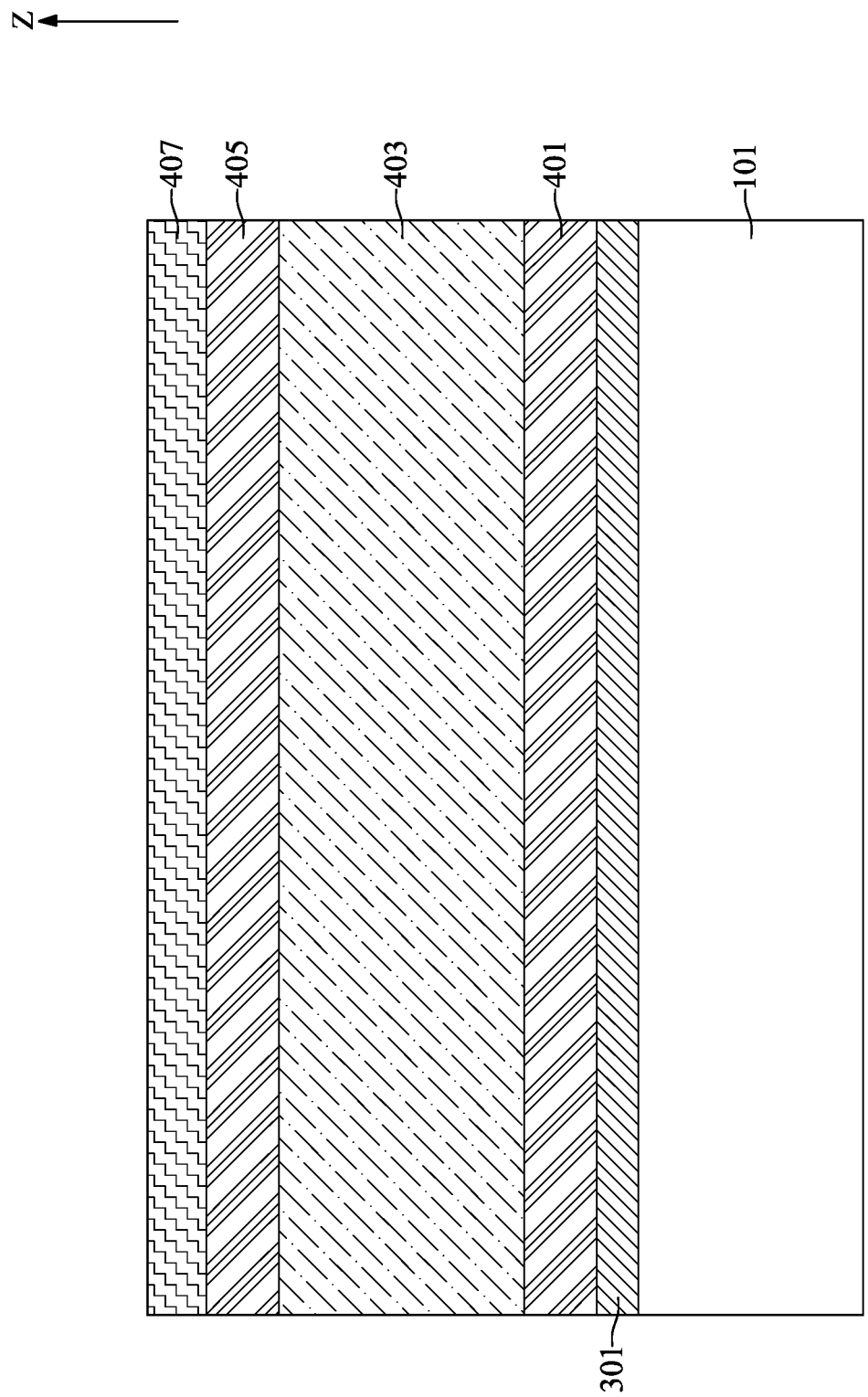
FIGS. 2 to 11 illustrate, in schematic cross-sectional view diagrams, a flow for fabricating the semiconductor device in accordance with one embodiment of the present disclosure.

With reference to FIG. 2, in some embodiments, the substrate 101 may be a bulk semiconductor substrate that is composed entirely of at least one semiconductor material; the bulk semiconductor substrate does not contain any dielectrics, insulating layers, or conductive features. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consisting of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

In some embodiments, the substrate 101 may include a plurality of device elements (not shown for clarity), a plurality of dielectric layers (not shown for clarity), and a plurality of conductive features (not shown for clarity).

In some embodiments, the plurality of device elements may be formed on the bulk semiconductor substrate or the topmost semiconductor material layer. Some portions of the plurality of device elements may be formed in the bulk semiconductor substrate or the topmost semiconductor material layer. The plurality of device elements may be transistors such as complementary metal-oxide-semiconductor transistors, metal-oxide-semiconductor field-effect transistors, fin field-effect-transistors, the like, or a combination thereof.

In some embodiments, the plurality of dielectric layers may be formed on the bulk semiconductor substrate or the topmost semiconductor material layer and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The term "low-k" as used throughout the present disclosure denotes a dielectric material that has a dielectric constant of less than silicon dioxide. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

In some embodiments, the plurality of conductive features may include interconnect layers, conductive vias, and conductive pads. The interconnect layers may be separated from each other and may be horizontally disposed in the plurality of dielectric layers along the direction Z. In the present embodiment, the topmost interconnect layers may be designated as the conductive pads. The conductive vias may connect adjacent interconnect layers along the direction Z, adjacent device element and interconnect layer, and adjacent conductive pad and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements, and the plurality of conductive features may together configure functional units of the semiconductor device 1A. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

With reference to FIG. 2, the bottom dielectric layer 301 may be formed on the substrate 101. The bottom dielectric layer 301 may include, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the bottom dielectric layer 301 may include a self-planarizing material such as a spin-on glass or a spin-on low-k dielectric material such as SiLK™. The use of a self-planarizing dielectric material may avoid the need to perform a subsequent planarizing step. In some embodiments, the bottom dielectric layer 301 may be formed by a deposition process including, for example, chemical vapor deposition, plasma enhanced chemical vapor deposition, evaporation, or spin-on coating.

With reference to FIG. 2, a layer of first conductive material 401 may be formed on the bottom dielectric layer 301. In some embodiments, the first conductive material 401 may include, for example, titanium, titanium nitride, titanium silicon nitride, tantalum, tantalum nitride, tantalum silicon nitride, or combination thereof. In some embodiments, the layer of first conductive material 401 may be formed by, for example, atomic layer deposition, chemical vapor deposition, and/or sputtering. In some embodiments, the layer of first conductive material 401 may optionally undergo an oxidation, nitridation, or other process to form an oxide, nitride, and/or other metal compound in the layer of first conductive material 401.

With reference to FIG. 2, a layer of second conductive material 403 may be formed on the layer of first conductive material 401. In some embodiments, the second conductive material 403 may include, for example, aluminum, copper, and a combination thereof. In some embodiments, the second conductive material 403 is an alloy of aluminum and copper, and the content of aluminum is greater than the content of the copper. The addition of small quantities of copper to the aluminum has been found to improve the electromigration resistance while this addition further reduces the occurrence of hillocks, which is small protrusions of aluminum on the surface of the layer of aluminum. In some embodiments, the layer of second conductive material 403 may be formed by, for example, chemical vapor deposition, and/or sputtering. In some embodiments, a process temperature for forming the layer of second conductive material 403 may be between about 100° C. and about 400° C. In some embodiments, a process pressure for forming the layer of second conductive material 403 may be between about 1 mTorr and about 100 mTorr. In some embodiments, a thickness of the layer of second conductive material 403 may be between about 4000 angstroms and about 11000 angstroms.

With reference to FIG. 2, a layer of third conductive material 405 may be formed on the layer of second conductive material 403. In some embodiments, the third conductive material 405 may include, for example, titanium, titanium nitride, titanium silicon nitride, tantalum, tantalum nitride, tantalum silicon nitride, or combination thereof. In some embodiments, the layer of third conductive material 405 may be formed by, for example, atomic layer deposition, chemical vapor deposition, and/or sputtering. In some embodiments, the layer of third conductive material 405 may optionally undergo an oxidation, nitridation, or other process to form an oxide, nitride, and/or other metal compound in the layer of third conductive material 405.

Figure 3:
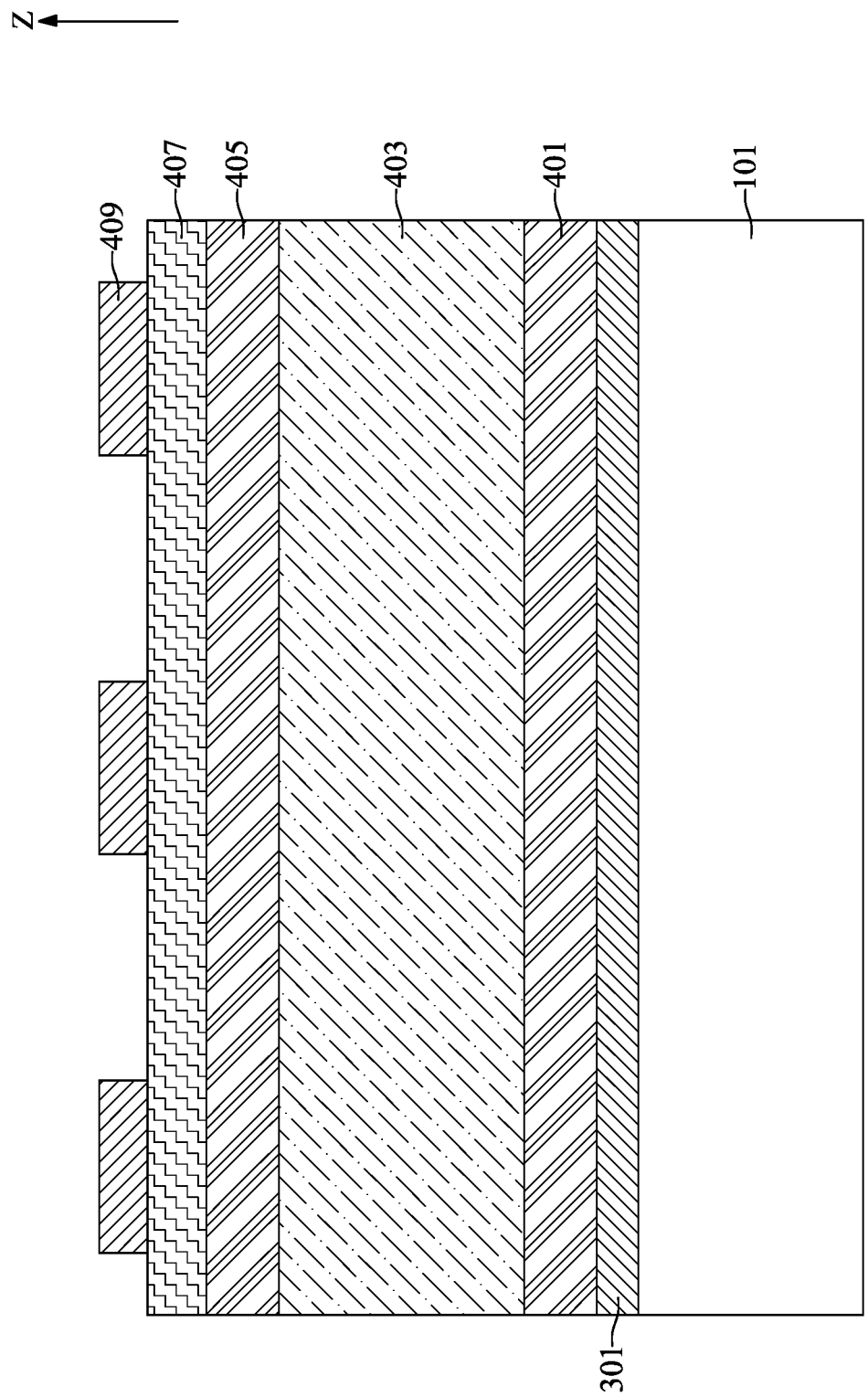
Figure 4:
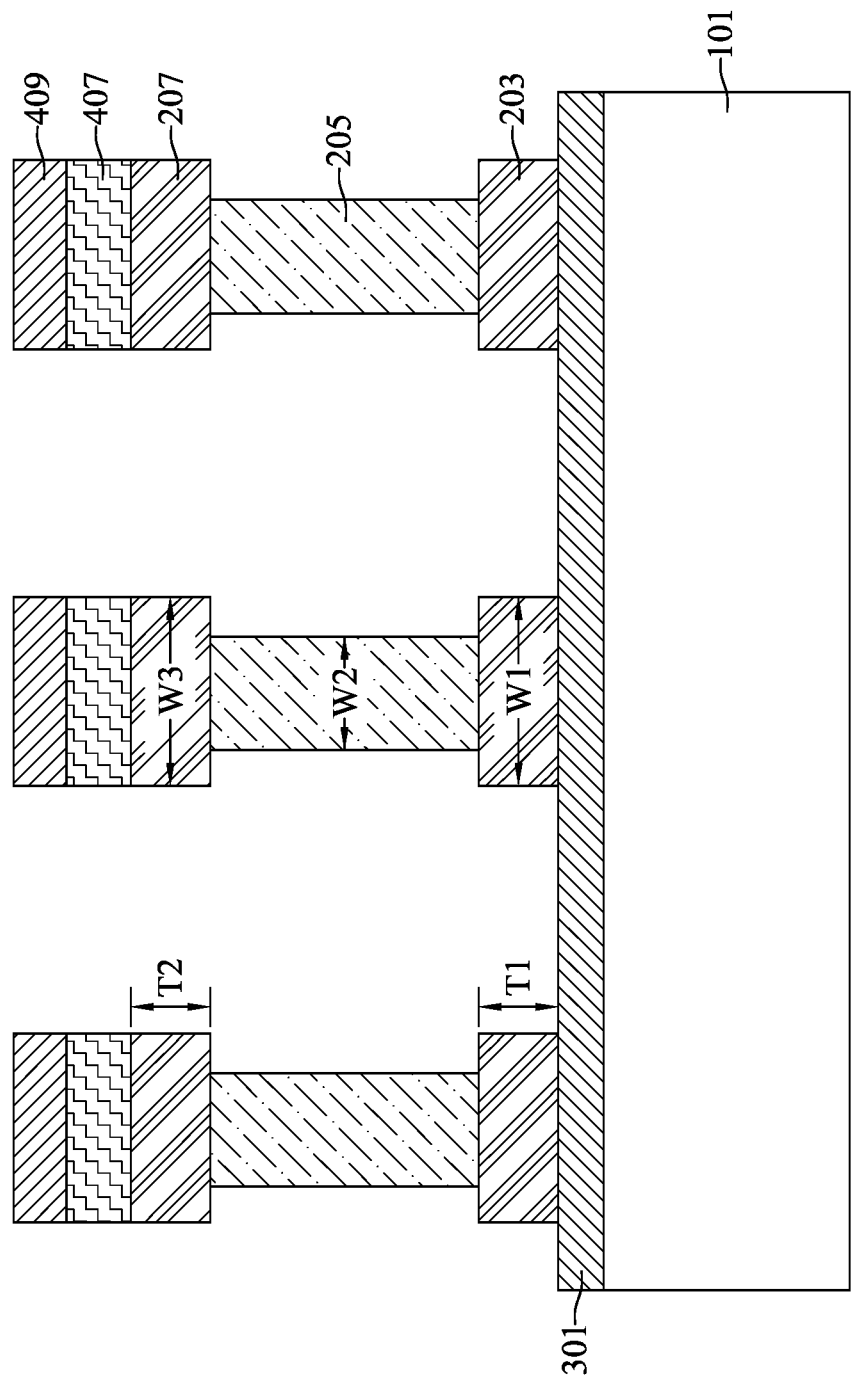

With reference to FIG. 2, an anti-reflective coating layer 407 may be formed on the layer of third conductive material 405. The anti-reflective coating layer 407 may suppress the reflections of the underlying layers during following patterning process (as shown in FIGS. 3 and 4) to provide an accurate pattern replication. In some embodiments, the anti-reflective coating layer 407 may include silicon nitride and titanium nitride.

In some embodiments, the anti-reflective coating layer 407 may be formed by reacting a processing gas comprising a silane-based compound and an oxygen and carbon containing compound, such as carbon dioxide or an organosilicon compound. The anti-reflective coating layer 407 may include at least silicon and oxygen, and may further include carbon. The anti-reflective coating layer 407 may be deposited by a plasma-enhanced chemical vapor deposition process. The anti-reflective coating layer 407 may exhibit a dielectric constant of about 11 or less, such as about 4 or less.

In some embodiments, suitable silane-based compounds for the plasma-enhanced chemical vapor deposition process may include oxygen-free silane-based compounds. Oxygen-free silane-based compounds may have the formula $Si_xH_{2x+2}$, $Si_xH_yCl_z$, $(CH_3)_zSi_xH_y$, or combinations thereof. X may be equal to 1 to 4, Y may be equal to 2X+1, and Z may be equal to 1 to 2X+2. Examples of such compounds include silane, disilane, chlorosilane, dichlorosilane, hexachlorosilane, methylsilane, dimethylsilane, trimethylsilane, tetramethylsilane, and combinations thereof. One or more of the oxygen-free silane-based compounds may be used in the plasma-enhanced chemical vapor deposition process. The silane-based compound, such as silane, may be supplied to a plasma processing chamber at a flow rate between about 100 sccm and about 700 sccm.

In some embodiments, suitable oxygen and carbon containing compounds may include carbon dioxide, carbon monoxide, and organosilicon compounds that contain oxygen. Suitable organosilicon compounds that contain oxygen include tetraethoxysilane, triethoxyfluorosilane, 1,3,5,7-tetramethylcyclotetrasiloxane, dimethyldiethoxysilane, dimethyldimethoxysilane, 1,3-dimethyldi siloxane, 1,1,3,3-tetramethyldisiloxane, hexamethyldisiloxane, 1,3-bis(silanomethylene)disiloxane, bis(1-methyldisiloxanyl)methane, 2,2-bis(1-methyldisiloxanyl)propane, hexamethoxydisiloxane, 1,3,5-trisilano-2,4,6-trimethylene, octamethylcyclotetrasiloxane, 1,3,5,7,9-pentamethylcyclopentasiloxane, 1,3,5,7-tetrasilano-2,6-dioxy-4,8-dimethylene, hexamethylcyclotrisiloxane, and combinations thereof.

With reference to FIG. 3, a first mask layer 409 may be formed on the anti-reflective coating layer 407. The first mask layer 409 may be a photoresist layer. The first mask layer 409 may have the pattern of the plurality of plug structures 201.

With reference to FIG. 4, a plug etch process using the first mask layer 409 as the pattern guide may be performed to remove portions of the anti-reflective coating layer 407, portions of the third conductive material 405, portions of the second conductive material 403, and portions of the first conductive material 401. After the plug etch process, the anti-reflective coating layer 407 may be divided into multiple segments. The layer of first conductive material 401 may be turned into a plurality of bottom conductive layers 203. The layer of second conductive material 403 may be turned into a plurality of middle conductive layers 205. The layer of third conductive material 405 may be turned into a plurality of top conductive layers 207.

In some embodiments, the plug etch process may be a multi-step etch process. For example, the plug etch process may include four etching stages for etching the anti-reflective coating layer 407, the third conductive material 405, the second conductive material 403, and the first conductive material 401, respectively. In some embodiments, the plug etch process may be an anisotropic etch process. In some embodiments, the plug etch process may include anisotropic etch processes and isotropic etch processes. For example, the plug etch process may be anisotropic during etching the anti-reflective coating layer 407 and may be isotropic during etching the second conductive material 403.

In some embodiments, the etch rate ratio of the second conductive material 403 to the anti-reflective coating layer 407 may be between about 100:1 and about 1.05:1, between about 15:1 and about 2:1, or between about 10:1 and about 2:1 during the second conductive material etching stage of the plug etch process. In some embodiments, the etch rate ratio of the second conductive material 403 to the third conductive material 405 may be between about 100:1 and about 1.05:1, between about 15:1 and about 2:1, or between about 10:1 and about 2:1 during the second conductive material etching stage of the plug etch process. In some embodiments, the etch rate ratio of the second conductive material 403 to the first conductive material 401 may be between about 100:1 and about 1.05:1, between about 15:1 and about 2:1, or between about 10:1 and about 2:1 during the second conductive material-etching stage of the plug etch process. In some embodiments, the etch rate ratio of the second conductive material 403 to the bottom dielectric layer 301 may be between about 100:1 and about 1.05:1, between about 15:1 and about 2:1, or between about 10:1 and about 2:1 during the second conductive material etching stage of the plug etch process.

In some embodiments, the etchants of the second conductive material etching stage of the plug etch process may be, for example, chlorine and argon. The etchant flow may be about 200 sccm for the chlorine and 1000 sccm for the argon. The process temperature of the second conductive material etching stage of the plug etch process may be between about 50° C. and about 200° C. The process pressure of the second conductive material etching stage of the plug etch process may be between about 50 mTorr and about 10 Torr. The process duration of the second conductive material etching stage of the plug etch process may be between about 30 seconds and about 200 seconds. In some embodiments, the bottom dielectric layer 301 may serve as an etch stop layer for the plug etch process.

For brevity, clarity, and convenience of description, only one bottom conductive layer 203, one middle conductive layer 205, and one top conductive layer 207 are described.

With reference to FIG. 4, the width W1 of the bottom conductive layer 203 may be greater than the width W2 of the middle conductive layer 205. The width W2 of the middle conductive layer 205 may be less than the width W3 of the top conductive layer 207. The width W1 of the bottom conductive layer 203 and the width W3 of the top conductive layer 207 may be substantially the same. In other words, the bottom conductive layer 203, the middle conductive layer 205, and the top conductive layer 207 may together configure a I-shaped cross-sectional profile.

In some embodiments, the thickness T1 of the bottom conductive layer 203 and the thickness T2 of the top conductive layer 207 may be substantially the same. In some embodiments, the thickness T1 of the bottom conductive layer 203 and the thickness T2 of the top conductive layer 207 may be different. For example, the thickness T1 of the bottom conductive layer 203 may be greater than the thickness T2 of the top conductive layer 207.

Figure 5:
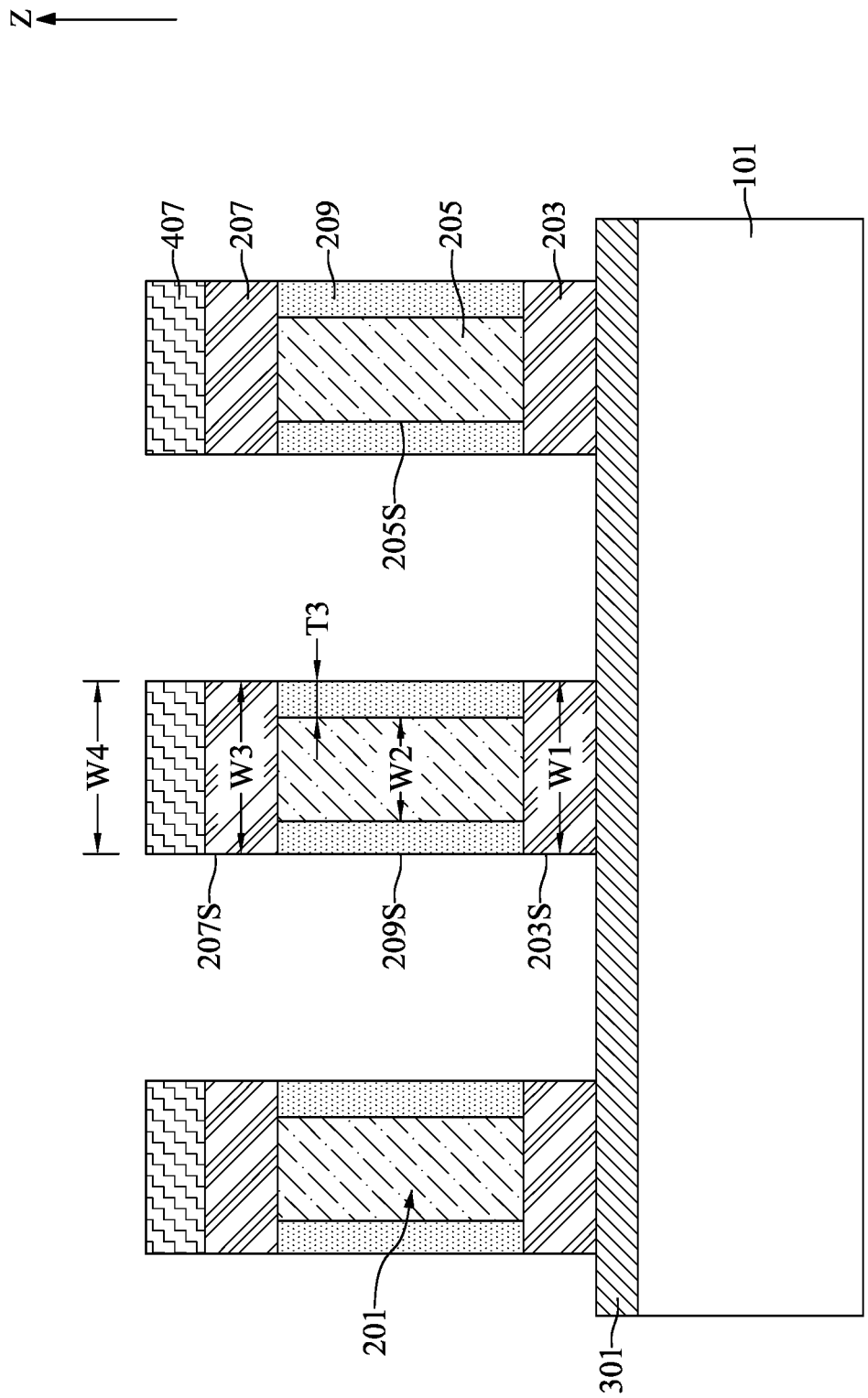

With reference to FIG. 5, a plurality of insulating covering layer 209 may be selectively formed on and completely covering the sidewalls 205S of the plurality of middle conductive layers 205, respectively and correspondingly. For brevity, clarity, and convenience of description, only one insulating covering layer 209 is described. A thermal oxidation process may be performed to the intermediate semiconductor device illustrated in FIG. 4, an oxide layer (e.g., aluminum oxide) may be formed on the sidewall 205S of the middle conductive layer 205 including aluminum. The oxide layer may be referred to as the insulating covering layer 209. The insulating covering layer 209 may prevent the middle conductive layer 205 being contaminated or damaged during the following semiconductor processes. In addition, the insulating covering layer 209 may prevent the metal ions in the middle conductive layer 205 diffusing out to contaminate adjacent elements, which may cause short of the short of adjacent conductive features.

In some embodiments, the width W1 of the bottom conductive layer 203 and the total width W4 consisting of the width W2 of the middle conductive layer 205 and the thickness T3 of the insulating covering layer 209 may be substantially the same. the width W2 of the top conductive layer 207 and the total width W4 consisting of the width W2 of the middle conductive layer 205 and the thickness T3 of the insulating covering layer 209 may be substantially the same. In other words, the surface composed of the sidewall 203S of the bottom conductive layer 203, the sidewall 209S of the insulating covering layer 209, and the sidewall 207S of the top conductive layer 207 may be substantially vertical. It should be noted that, in the description of the present disclosure, a surface is "substantially vertical" if there exists a vertical plane from which the surface does not deviate by more than three times the root mean square roughness of the surface.

In some embodiments, a ratio of the thickness T3 of the insulating covering layer 209 to the width W2 of the middle conductive layer 205 may be between about 1:20 and about 1:2000, between about 1:50 and about 1:1800, or between about 1:200 and about 1:1600.

Figure 6:
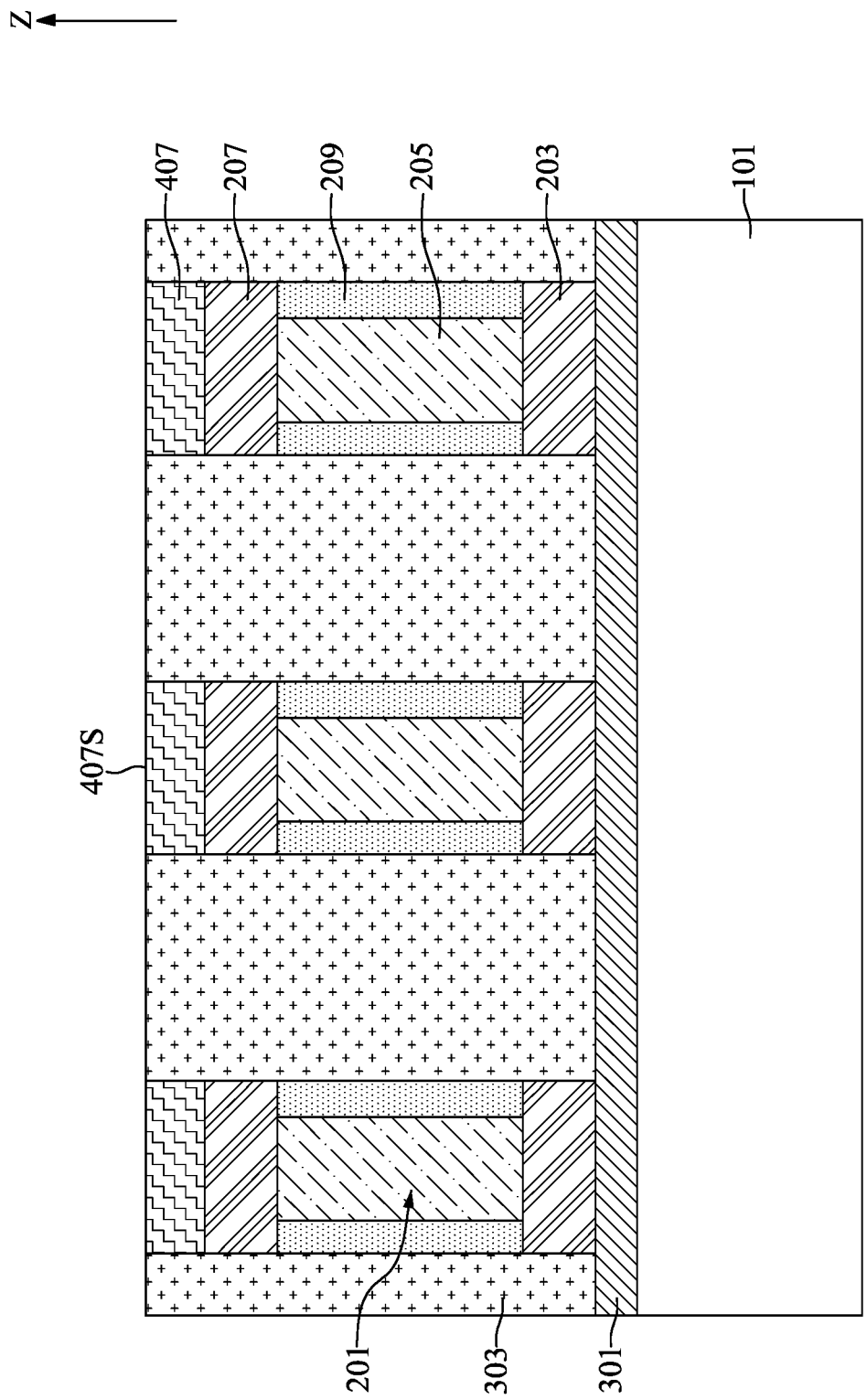
Figure 7:
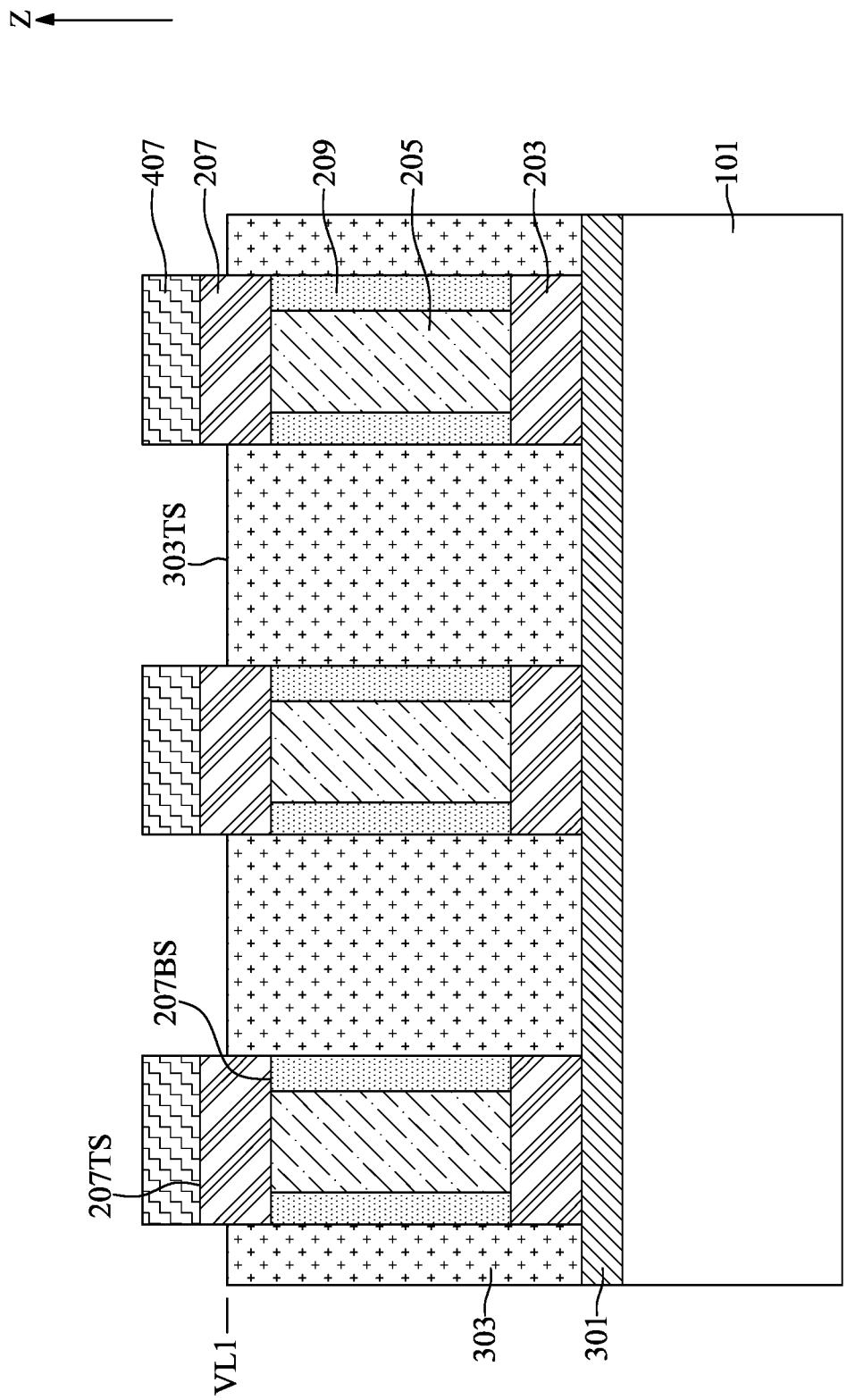

With reference to FIGS. 1, 6, and 7, at step S13, a first dielectric layer 303 may be formed on the bottom dielectric layer 301.

With reference to FIG. 6, the first dielectric layer 303 may be formed on the bottom dielectric layer 301 and completely covering the plurality of plug structures 201 and the anti-reflective coating layer 407. In other words, the first dielectric layer 303 may completely surround the plurality of plug structures 201. It should be noted that, the middle conductive layer 205 are separated from the first dielectric layer 303 by the insulating covering layer 209. A planarization process, such as chemical mechanical polishing, may be performed until the top surface of the anti-reflective coating layer 407 is exposed to remove excess material and provide a substantially flat surface for subsequent processing steps. In some embodiments, the first dielectric layer 303 may be formed of, for example, a porous dielectric material. In some embodiments, the first dielectric layer 303 may be formed of, for example, a porous low-k dielectric material, a porous polymeric material, organic spin-on glass, or a combination thereof, but is not limited thereto. In some embodiments, the pores (not shown for clarity) of the first dielectric layer 303 range in having a mean diameter between about 10 angstroms and about 200 angstroms, depending on the type of material of the first dielectric layer 303.

With reference to FIG. 7, an etch back process may be performed to lower the top surface 303TS of the first dielectric layer 303 to a vertical level VL1 between the top surface 207TS of the top conductive layer 207 and the bottom surface 207BS of the top conductive layer 207. During the etch back process, the anti-reflective coating layer 407 may serve as a protection layer to prevent the underlying top conductive layer 207 from being damaged. In some embodiments, the etch back process may be an anisotropic dry etch process. In some embodiments, the etch rate ratio of the first dielectric layer 303 to the anti-reflective coating layer 407 may be between about 100:1 and about 1.05:1, between about 15:1 and about 2:1, or between about 10:1 and about 2:1 during the etch back process. In some embodiments, the etch rate ratio of the first dielectric layer 303 to the top conductive layer 207 may be between about 100:1 and about 1.05:1, between about 15:1 and about 2:1, or between about 10:1 and about 2:1 during the etch back process.

Figure 8:
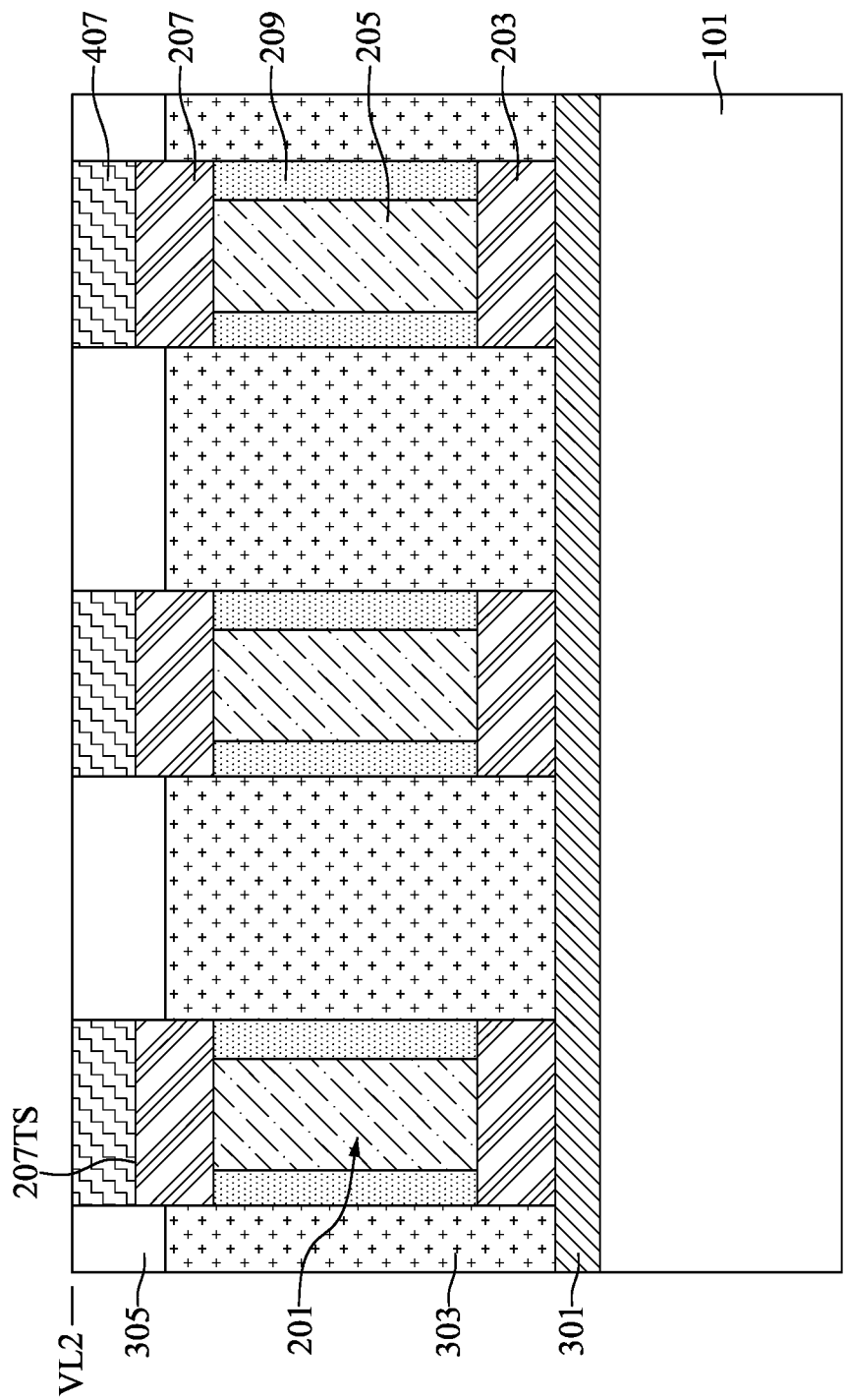
Figure 9:
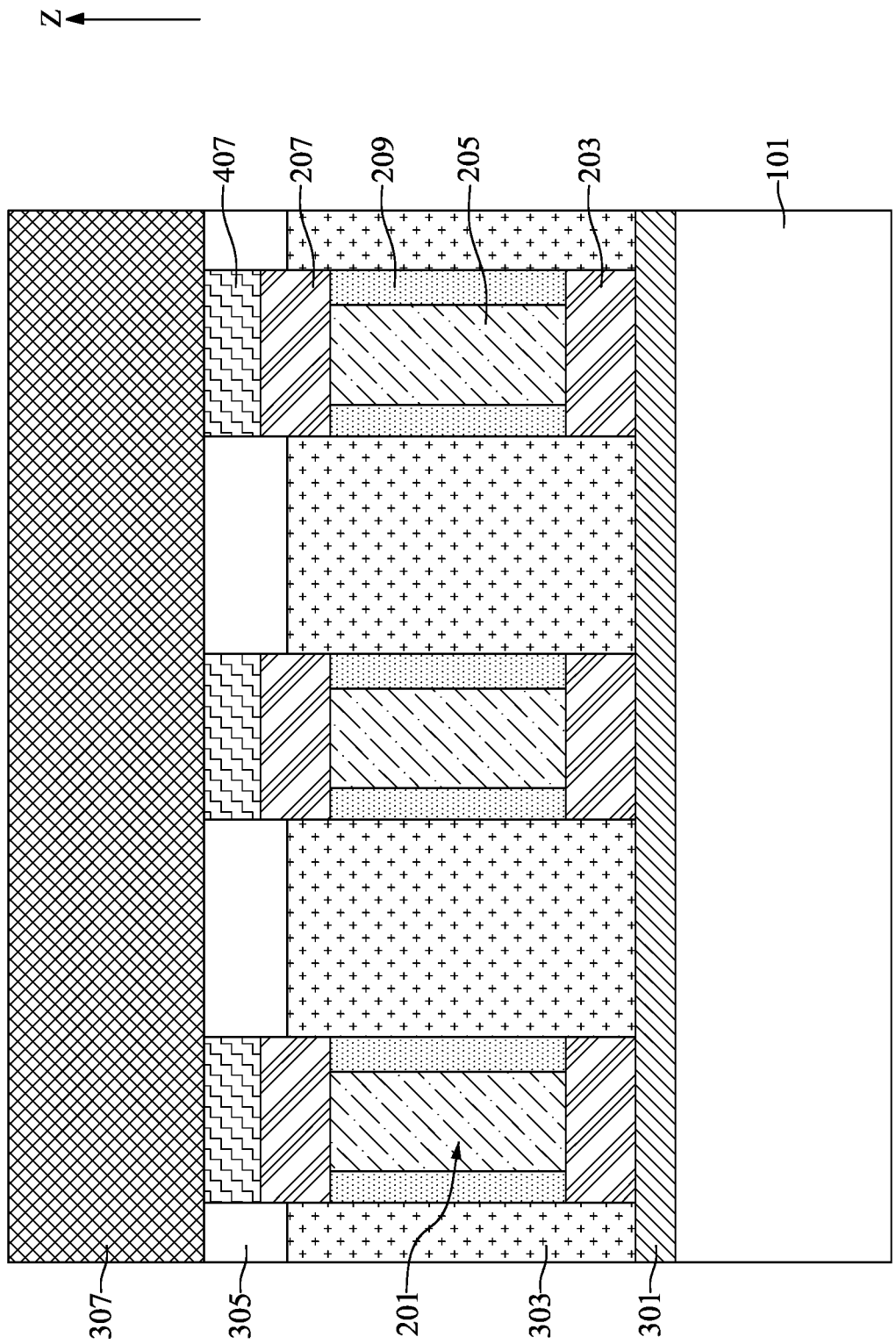

With reference to FIGS. 1, 8, 9, at step S15, a second dielectric layer 305 may be formed on the first dielectric layer 303, and a third dielectric layer 307 may be formed on the second dielectric layer 305.

With reference to FIG. 8, the second dielectric layer 305 may be formed on the first dielectric layer 303 and completely covering the plurality of plug structures 201 and the anti-reflective coating layer 407. In some embodiments, the second dielectric layer 305 may be formed of a different material from the first dielectric layer 303. For example, the second dielectric layer 305 may be formed of a material having a greater hardness than that of the first dielectric layer 303. In some embodiments, the second dielectric layer 305 may be formed of, for example, silicon oxide, borophosphosilicate glass, undoped silicate glass, fluorinated silicate glass, the like, or a combination thereof. The second dielectric layer 305 may be formed by deposition processes such as chemical vapor deposition, plasma-enhanced chemical vapor deposition, or the like. A planarization process, such as chemical mechanical polishing, may be performed until the top surface 407TS of the anti-reflective coating layer 407 is exposed to remove excess material and provide a substantially flat surface for subsequent processing steps. After the planarization process, the top surface 305TS of the second dielectric layer is at a vertical level VL2 greater the top surface 207TS of the top conductive layer 207.

With reference to FIG. 9, the third dielectric layer 307 may be formed on the second dielectric layer 305 and covering the anti-reflective coating layer 407. The third dielectric layer 307 may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the third dielectric layer 307 may include a self-planarizing material such as a spin-on glass or a spin-on low-k dielectric material such as SiLK™. The use of a self-planarizing dielectric material may avoid the need to perform a subsequent planarizing step. In some embodiments, the third dielectric layer 307 may be formed by a deposition process including, for example, chemical vapor deposition, plasma enhanced chemical vapor deposition, evaporation, or spin-on coating.

Figure 10:
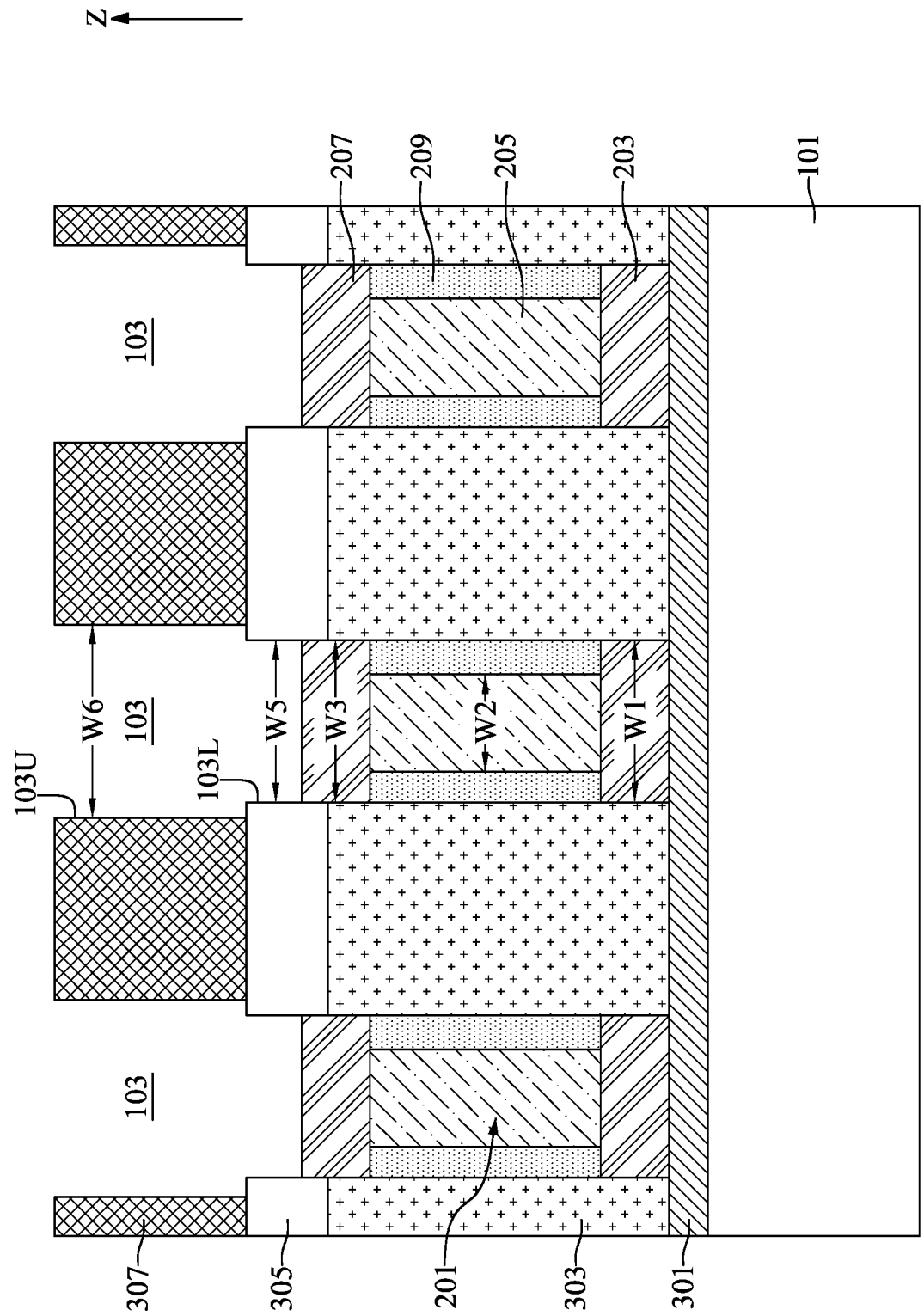
Figure 11:
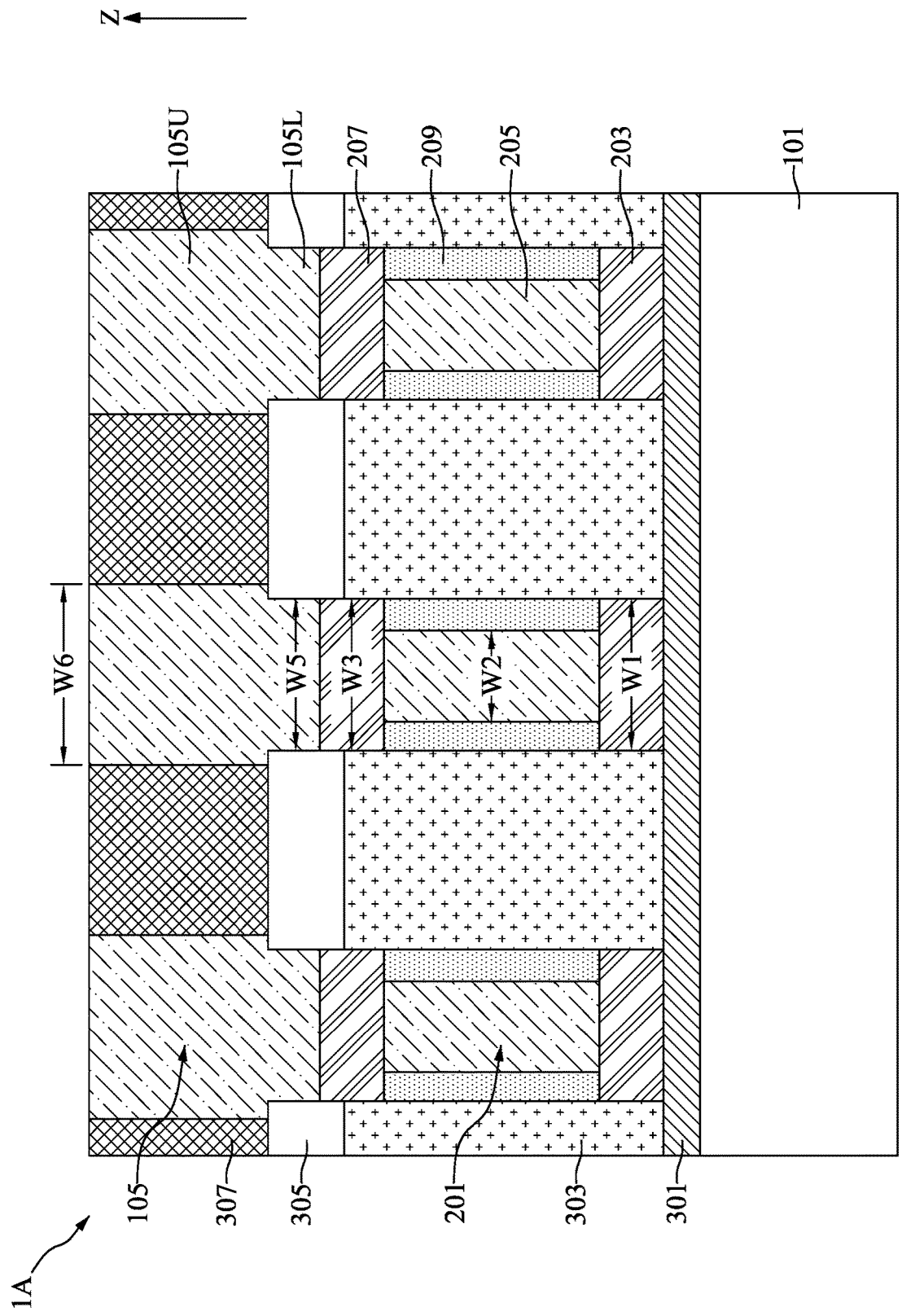

With reference to FIGS. 1, 10, and 11, at step S17, a plurality of contacts 105 may be formed in the third dielectric layer 307 and electrically connected to the plurality of plug structures 201.

With reference to FIG. 10, an opening etch process may be performed to remove portions of the third dielectric layer 307 and to completely remove the anti-reflective coating layer 407. After the opening etch process, the plurality of contact holes 103 may be formed and the plurality of top conductive layers 207 may be exposed through the plurality of contact holes 103. The etch rate ratio of the third dielectric layer 307 to the top conductive layer 207 may be between about 100:1 and about 1.05:1, between about 15:1 and about 2:1, or between about 10:1 and about 2:1 during the opening etch process etch process. The etch rate ratio of the anti-reflective coating layer 407 to the top conductive layer 207 may be between about 100:1 and about 1.05:1, between about 15:1 and about 2:1, or between about 10:1 and about 2:1 during the opening etch process etch process.

For brevity, clarity, and convenience of description, only one contact hole 103 is described.

With reference to FIG. 10, the contact hole 103 may include a lower portion 103L and an upper portion 103U. The lower portion 103L of the contact hole 103 may be at the position where the anti-reflective coating layer 407 was occupied. The upper portion 103U may be disposed along the third dielectric layer 307 and communicating with the lower portion 103L. The width W5 of the lower portion 103L may be about the same with the width W3 of the top conductive layer 207. The width W6 of the upper portion 103U may be greater than the width W5 of the lower portion 103L.

With reference to FIG. 11, the plurality of contacts 105 may be formed in the plurality of contact holes 103, respectively and correspondingly. The plurality of contacts 105 may be electrically connected to the plurality of plug structures 201. The plurality of contacts 105 may be formed of, for example, polycrystalline silicon, polycrystalline germanium, polycrystalline silicon germanium, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or combinations thereof. The plurality of contacts 105 may be formed by, for example, chemical vapor deposition, physical vapor deposition, sputtering, or the like. A planarization process, such as chemical mechanical polishing, may be performed until the top surface of the third dielectric layer 307 is exposed to remove excess material and provide a substantially flat surface for subsequent processing steps.

For brevity, clarity, and convenience of description, only one contact 105 is described. The contact 105 may include a lower portion 105L and an upper portion 105U. The lower portion 105L of the contact 105 may be formed on the top conductive layer 207 and surrounding by the second dielectric layer 305. The upper portion 105U of the contact 105 may be formed on the lower portion 105L of the contact 105 and surrounding by the third dielectric layer 307. Due to the profile of the contact 105 is determined by the contact hole 103, the lower portion 105L of the contact 105 may have the same width W5 as the lower portion 103L of the contact hole 103 and the upper portion 105U of the contact 105 may have the same width W6 as the upper portion 103U of the contact hole 103. In some embodiments, the width W5 of the lower portion 105L may be about the same with the width W3 of the top conductive layer 207. The width W6 of the upper portion 105U may be greater than the width W5 of the lower portion 105L.

FIGS. 12 to 15 illustrate, in schematic cross-sectional view diagrams, a flow for fabricating a semiconductor device 1B in accordance with another embodiment of the present disclosure.

Figure 12:
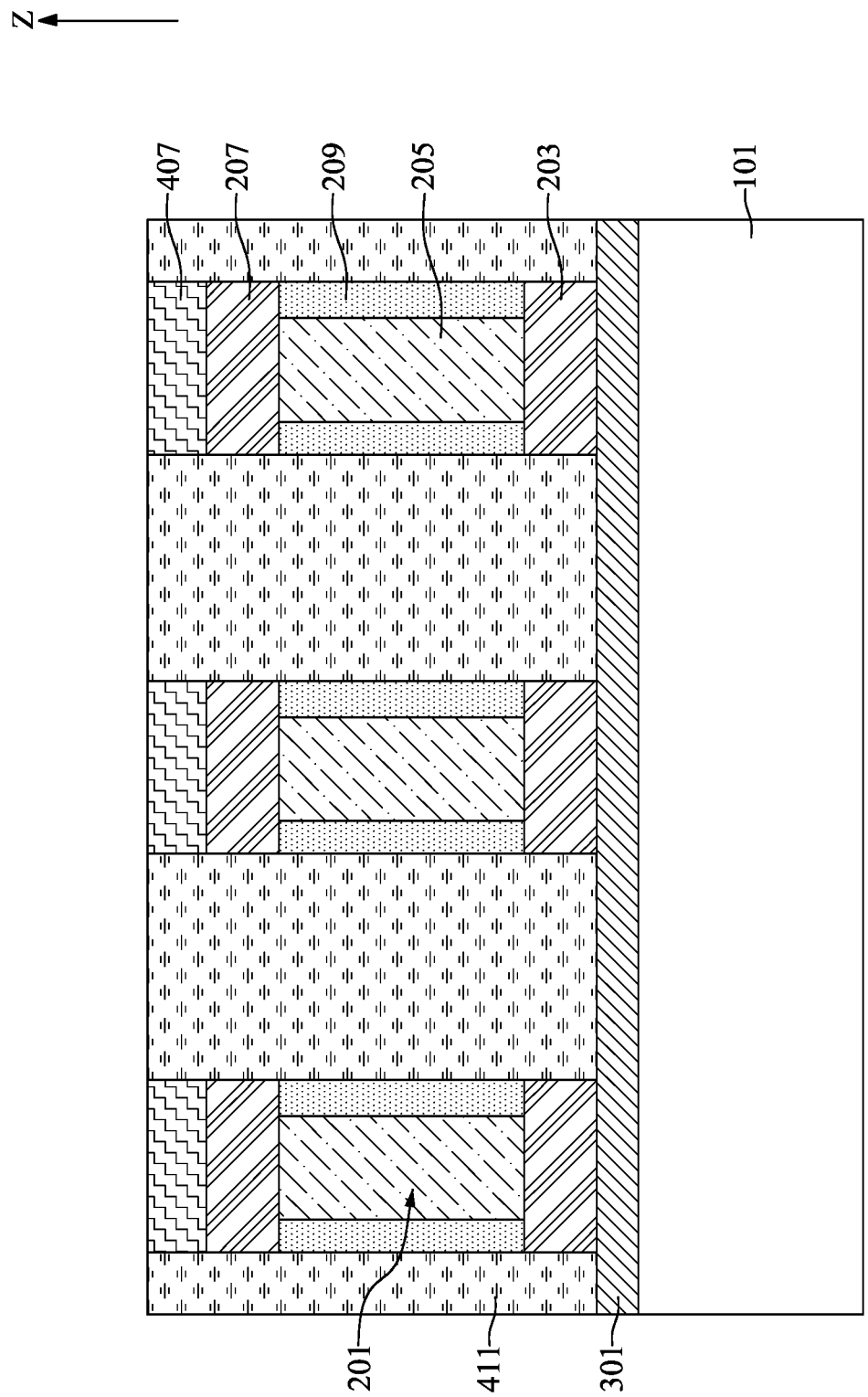
FIGS. 12 to 15 illustrate, in schematic cross-sectional view diagrams, a flow for fabricating a semiconductor device in accordance with another embodiment of the present disclosure.

With reference to FIG. 12, an intermediate semiconductor device may be fabricated with a procedure similar to that illustrated in FIGS. 2 to 5, and descriptions thereof are not repeated herein. A layer of energy-removable material 411 may be formed on the bottom dielectric layer 301 and surrounding the plurality of plug structures 201. The energy-removable material 411 may include a material such as a thermal decomposable material, a photonic decomposable material, an e-beam decomposable material, or a combination thereof. For example, the energy-removable material 411 may include a base material and a decomposable porogen material that is sacrificially removed upon being exposed to an energy source. The base material may include a methylsilsesquioxane based material. The decomposable porogen material may include a porogen organic compound that provides porosity to the base material of the energy-removable material 411.

Figure 13:
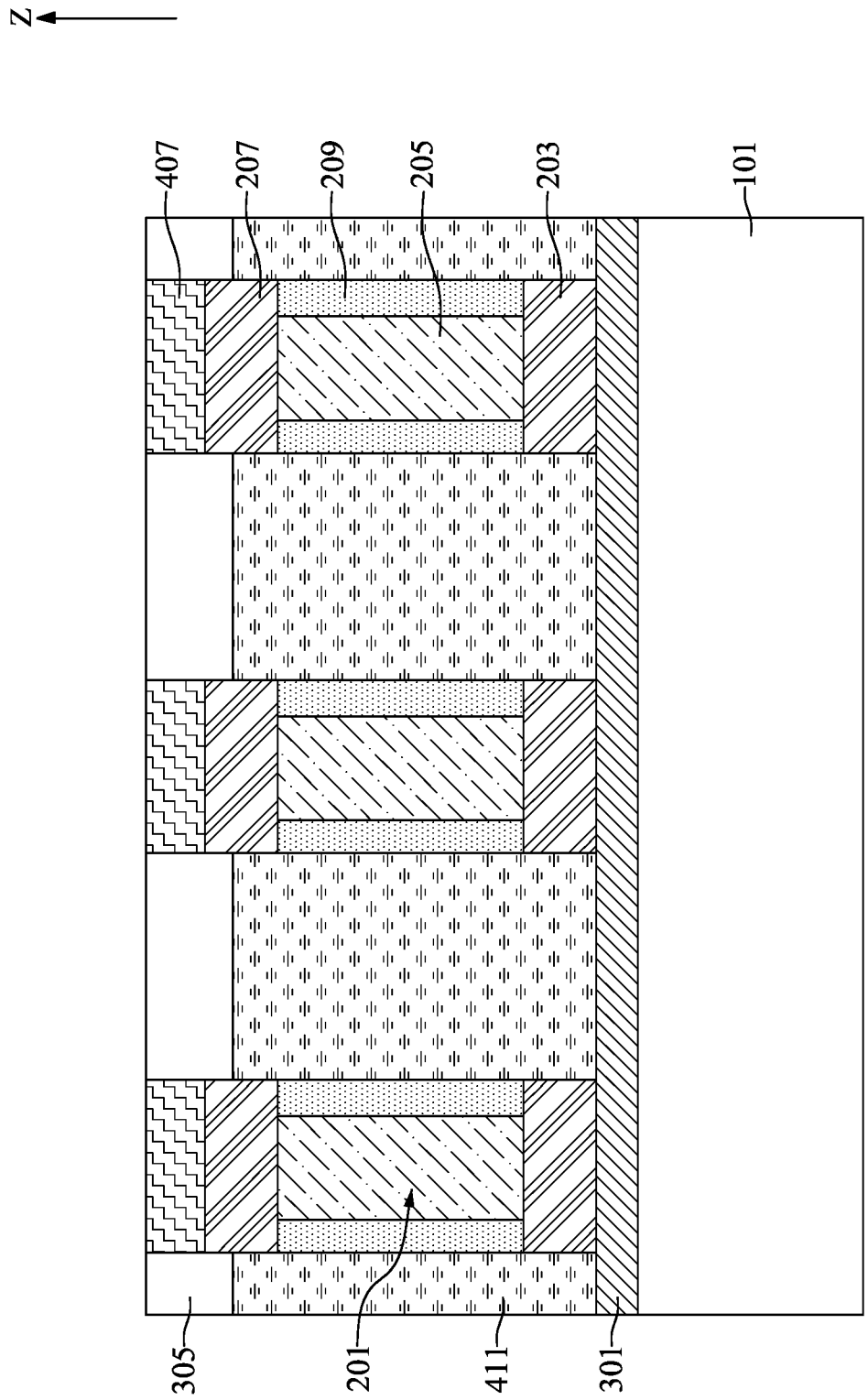

With reference to FIG. 13, the layer of energy-removable material 411 may be recessed with a procedure similar to that illustrated in FIG. 7, and descriptions thereof are not repeated herein. The second dielectric layer 305 may be formed on the layer of energy-removable material 411 with a procedure similar to that illustrated in FIG. 8, and descriptions thereof are not repeated herein. The second dielectric layer 305 may serve as a capping layer for the layer of energy-removable material 411.

Figure 14:
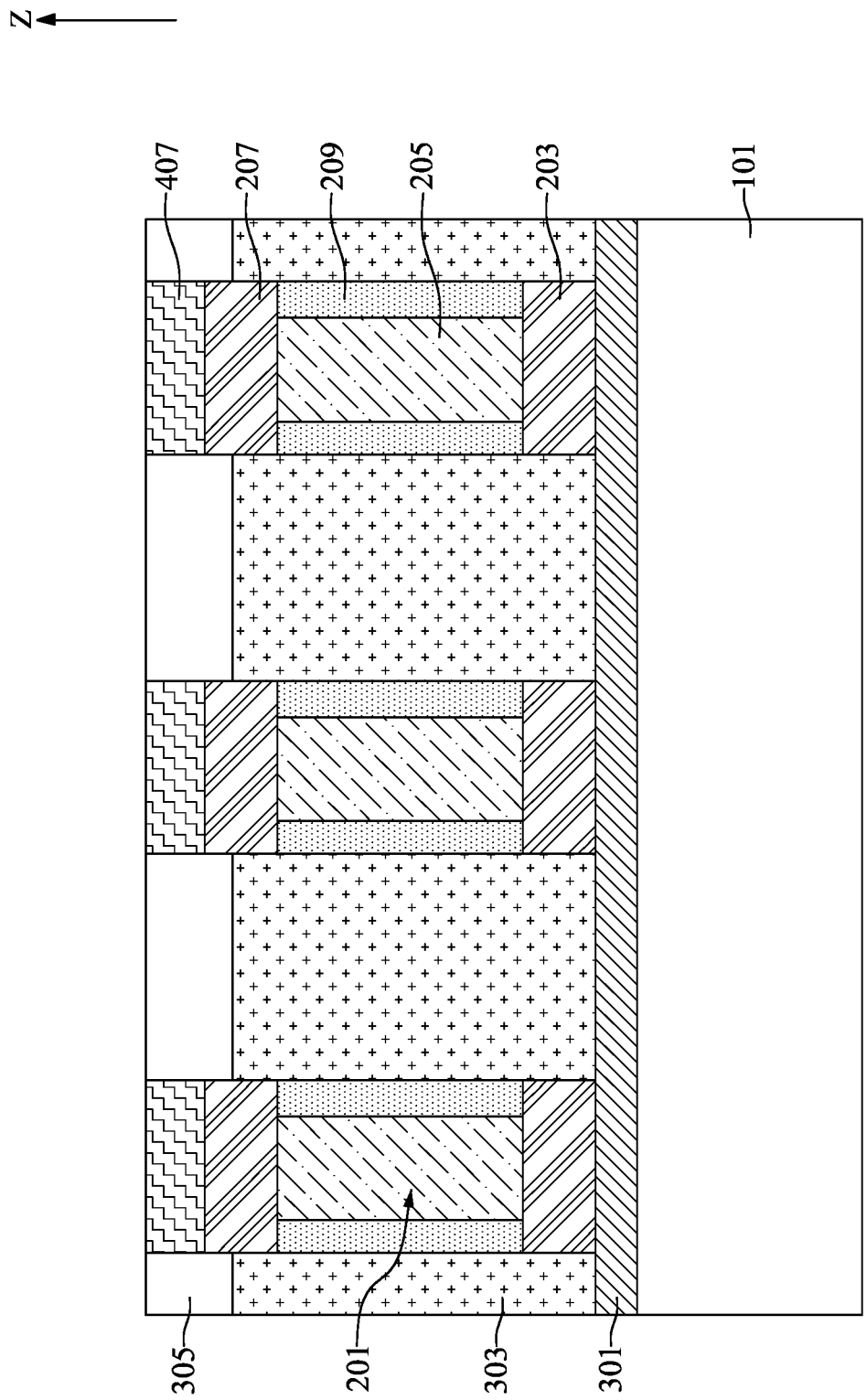

With reference to FIG. 14, an energy treatment may be performed to the intermediate semiconductor device in FIG. 13 by applying the energy source thereto. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the energy-removable material to generate empty spaces (pores), with the base material remaining in place. After the energy treatment, the layer of energy-removable material 411 may be turned into the first dielectric layer 303.

In some embodiments, the first dielectric layer 303 may include a skeleton and a plurality of empty spaces disposed among the skeleton. The plurality of empty spaces may connect to each other and may be filled with air. The skeleton may include, for example, silicon oxide, low-dielectric materials, or methylsilsesquioxane. The first dielectric layer 303 may have a porosity between 25% and 100%. It should be noted that, when the porosity is 100%, it means the first porous layer 415 includes only an empty space and the first dielectric layer 303 may be regarded as an air gap. In some embodiments, the porosity of the first dielectric layer 303 may be between 45% and 95%. The plurality of empty spaces of the first dielectric layer 303 may be filled with air. As a result, a dielectric constant of the first dielectric layer 303 may be significantly lower than a layer formed of, for example, silicon oxide. Therefore, the first dielectric layer 303 may significantly reduce the parasitic capacitance between the plurality of plurality of plug structures 201. That is, the first dielectric layer 303 may significantly alleviate an interference effect between electrical signals induced or applied to the plurality of plug structures 201.

Figure 15:
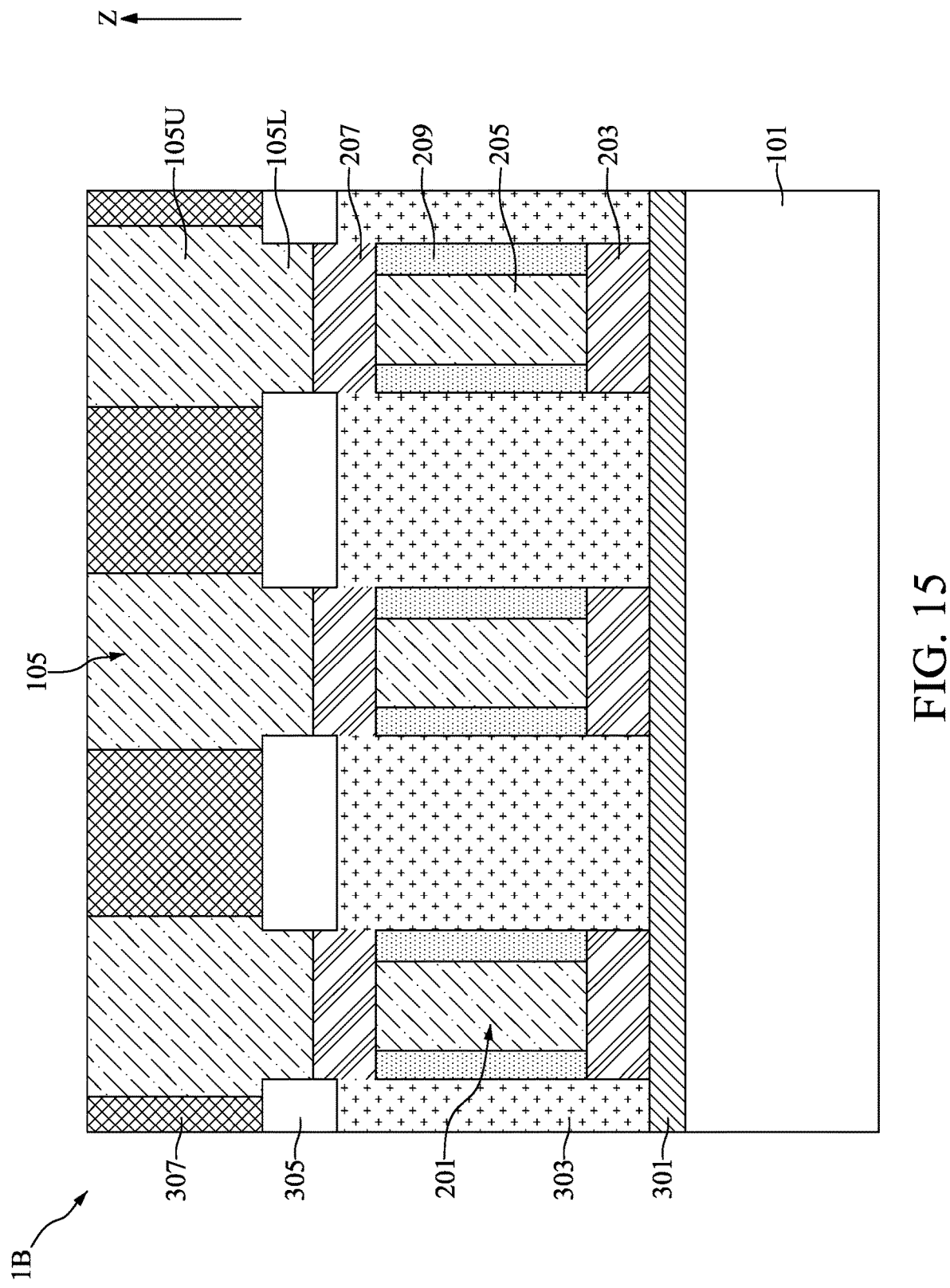

With reference to FIG. 15, the third dielectric layer 307 and the plurality of contacts 105 may be formed with a procedure similar to that illustrated in FIGS. 9 to 11, and descriptions thereof are not repeated herein.

One aspect of the present disclosure provides a semiconductor device including a substrate; a plug structure including a bottom conductive layer positioned on the substrate, a middle conductive layer positioned on the bottom conductive layer, a top conductive layer positioned on the middle conductive layer, and an insulating covering layer covering a sidewall of the middle conductive layer and positioned between the bottom conductive layer and the top conductive layer; and a first dielectric layer positioned on the substrate and surrounding the plug structure. A width of the bottom conductive layer is greater than a width of the middle conductive layer. A width of the top conductive layer is greater than the width of the middle conductive layer.

Another aspect of the present disclosure provides a method for fabricating a semiconductor device including providing a substrate; sequentially forming a layer of first conductive material, a layer of second conductive material, a layer of third conductive material, and an anti-reflective coating layer over the substrate; performing a plug etch process to turn the layer of first conductive material into a bottom conductive layer on the substrate, turn the layer of second conductive material into a middle conductive layer on the bottom conductive layer, and turn the layer of third conductive material into a top conductive layer on the middle conductive layer; selectively forming an insulating covering layer on a sidewall of the middle conductive layer, wherein the bottom conductive layer, the middle conductive layer, the top conductive layer, and the insulating covering layer together configure a plug structure; and forming a first dielectric layer on the substrate and surrounding the plug structure. A width of the bottom conductive layer is greater than a width of the middle conductive layer, and a width of the top conductive layer is greater than the width of the middle conductive layer.

Due to the design of the semiconductor device of the present disclosure, the insulating covering layer 209 may prevent the metal ions in the middle conductive layer 205 diffusing out to contaminate adjacent elements (e.g., the first dielectric layer 303) so that short between adjacent conductive features may be reduced. As a result, the reliability and electrical characterization performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a substrate;
   forming a bottom dielectric layer on the substrate;
   sequentially forming a layer of first conductive material, a layer of second conductive material, a layer of third conductive material, and
   an anti-reflective coating layer over the substrate;
   performing a plug etch process to turn the layer of first conductive material into a bottom conductive layer on the substrate, turn the layer of second conductive material into a middle conductive layer on the bottom conductive layer, and turn the layer of third conductive material into a top conductive layer on the middle conductive layer;

selectively forming an insulating covering layer on a sidewall of the middle conductive layer, wherein the bottom conductive layer, the middle conductive layer, the top conductive layer, and the insulating covering layer together configure a plug structure; and forming a first dielectric layer on the substrate and surrounding the plug structure;

wherein a width of the bottom conductive layer is greater than a width of the middle conductive layer, and a width of the top conductive layer is greater than the width of the middle conductive layer.

2. The method for fabricating the semiconductor device of claim 1, wherein the first dielectric layer comprises a porous dielectric material, the middle conductive layer comprises aluminum and copper, the bottom conductive layer and the top conductive layer comprises titanium and titanium nitride, and the insulating covering layer comprises aluminum oxide.

3. The method for fabricating the semiconductor device of claim 2, wherein the bottom dielectric layer is formed between the first dielectric layer and the substrate.

4. The method for fabricating the semiconductor device of claim 3, further comprising performing an etch back process to lower a top surface of the first dielectric layer to a vertical level between a top surface of the top conductive layer and a bottom surface of the top conductive layer.

5. The method for fabricating the semiconductor device of claim 4, further comprising:
forming a second dielectric layer on the first dielectric layer and surrounding the top conductive layer and the anti-reflective coating layer;
forming a third dielectric layer on the second dielectric layer and the anti-reflective coating layer;
forming a contact hole by removing the anti-reflective coating layer and a portion of the third dielectric layer, wherein the top conductive layer is exposed through the contact hole; and
forming a contact in the contact hole and electrically connected to the top conductive layer.

6. The method for fabricating the semiconductor device of claim 5 wherein a hardness of the second dielectric layer is greater than a hardness of the first dielectric layer.

7. The method for fabricating the semiconductor device of claim 6, wherein the bottom dielectric layer comprises silicon dioxide, undoped silicate glass, fluorosilicate glass, borophosphosilicate glass, a spin-on low-k dielectric layer, a chemical vapor deposition low-k dielectric layer, or a combination thereof.

* * * * *